United States Patent
Jun et al.

(10) Patent No.: US 11,742,443 B2
(45) Date of Patent: *Aug. 29, 2023

(54) SEMICONDUCTOR NANOCRYSTAL, AND METHOD OF PREPARING THE SAME

(71) Applicant: SAMSUNG ELECTRONICS CO., LTD., Suwon-si (KR)

(72) Inventors: Shin Ae Jun, Seongnam-si (KR); Eun Joo Jang, Suwon-si (KR); Soo Kyung Kwon, Anyang-si (KR); Taek Hoon Kim, Hwaseong-si (KR); Won Joo Lee, Pocheon-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 17/171,198

(22) Filed: Feb. 9, 2021

(65) Prior Publication Data

US 2021/0167228 A1 Jun. 3, 2021

Related U.S. Application Data

(63) Continuation of application No. 16/234,694, filed on Dec. 28, 2018, now Pat. No. 10,950,741, which is a
(Continued)

(30) Foreign Application Priority Data

Oct. 26, 2012 (KR) .................. 10-2012-0119887

(51) Int. Cl.
*H01L 31/0296* (2006.01)
*H01L 31/0304* (2006.01)
(Continued)

(52) U.S. Cl.
CPC ...... *H01L 31/0296* (2013.01); *H01L 31/0304* (2013.01); *H01L 31/035218* (2013.01);
(Continued)

(58) Field of Classification Search
CPC .................................................. H01L 31/0296
See application file for complete search history.

(56) References Cited

U.S. PATENT DOCUMENTS 6,322,901 B1  11/2001  Bawendi et al.
7,867,557 B2   1/2011  Pickett et al.
(Continued)

FOREIGN PATENT DOCUMENTS

JP   2010532409 A   10/2010
JP   2011505432 A    2/2011
(Continued)

OTHER PUBLICATIONS

Ippen et al., "InP/ZnSe/ZnS: A Novel Multishell System for InP Quantum Dots for Improved Luminescence Efficiency and Its application in a Light-Emitting Device", Journal of Information Display, vol. 13, Issue 2, Jun. 2012, pp. 91-95.
(Continued)

*Primary Examiner* — William D Young
(74) *Attorney, Agent, or Firm* — CANTOR COLBURN LLP

(57) ABSTRACT

A nanocrystal including a core including a Group III element and a Group V element, and a monolayer shell on the surface of the core, the shell including a compound of the formula $ZnSe_xS_{(1-x)}$, wherein $0 \leq x \leq 1$, and wherein an average mole ratio of Se:S in the monolayer shell ranges from about 2:1 to about 20:1.

15 Claims, 15 Drawing Sheets

Related U.S. Application Data continuation of application No. 14/039,788, filed on Sep. 27, 2013, now Pat. No. 10,170,648.

(51) Int. Cl.
*H01L 31/0352* (2006.01)
*B82Y 40/00* (2011.01)
*B82Y 30/00* (2011.01)

(52) U.S. Cl.
CPC .............. *B82Y 30/00* (2013.01); *B82Y 40/00* (2013.01); *Y02E 10/544* (2013.01); *Y10S 977/774* (2013.01); *Y10S 977/89* (2013.01)

(56) References Cited

U.S. PATENT DOCUMENTS

| | | | |
|---|---|---|---|
| 8,017,181 B2 | 9/2011 | Shin et al. | |
| 8,247,073 B2 | 8/2012 | Jang et al. | |
| 2010/0052512 A1 | 3/2010 | Clough et al. | |
| 2010/0159248 A1 | 6/2010 | Jang et al. | |
| 2010/0289003 A1 | 11/2010 | Kahen et al. | |
| 2011/0006281 A1 | 1/2011 | Jang et al. | |
| 2011/0084250 A1 | 4/2011 | Jang et al. | |
| 2014/0117292 A1* | 5/2014 | Jun | H01L 31/0304 252/519.14 |

FOREIGN PATENT DOCUMENTS

| | | | |
|---|---|---|---|
| KR | 100768648 B1 | 10/2007 | |
| KR | 1020080044278 A | 5/2008 | |
| KR | 100853087 B1 | 8/2008 | |
| KR | 1020100033090 A | 3/2010 | |
| KR | 1020110004775 A | 1/2011 | |
| KR | 1020110039156 A | 4/2011 | |
| KR | 1020120019955 A | 3/2012 | |

OTHER PUBLICATIONS

Kim et al., "Engineering InAsxP1-x/InP/ZnSe III-V Alloyed Core/Shell Quantum Dots for the Newar-Infrared", J. Am. Chem. Soc. 2005,127, pp. 10526-10532.

Kim et al., "Large-Scale Synthesis of InPZnSj Alloy Quantum Dots with Dodecanethiol as a Composition Controller", J. Phys. Chem. Lett., vol. 3, 2012, pp. 214-218.

Kim et al., "Successive and large-scale synthesis of InP/ZnS quantum dots in a hybrid reactor and their application to white LEDs", Nanotechnology, vol. 23, Issue 6, 2012, Article No. 065602, pp. 1-7.

Korean Decision of Allowance for Patent for Korean Patent Application No. 10-2012-0119887 dated Jun. 19, 2015.

Li et al., "One-pot Synthesis of HIghly Luminescent InP/ZnS Nanocrystals without Precursor Injection", J. Am. Chem, Soc., 2008, vol. 130, pp. 11588-11589.

Lim et al., "InP@ZnSeS, Core@Composition Gradient Shell Quantum Dots with Enhanced Stability", Chemistry of Materials, 2011, vol. 23, Issue 20, pp. 4459-4463.

Mutlugun et al., Large-Area (over 50 cm x 50 cm) Freestanding Films of colloidal InP/ZnS Quantum Dots, Nano Letters, Vo., 12, 2012, pp. 3986-3993.

Tamang et al., "Aqueous Phase Transfer of InP/ZnS Nanocrystals Conserving Fluorescence and high Colloidal Stability", ACS Nano, vol. 5, No. 12, 2011, pp. 9392-9402.

Thuy et al., "Comparative photoluminescence study of close-packed and colloidal InP/ZnS quantum dots", Appl. Phys. Lett., vol. 96, 2010 pp. 073102-1-073102-3.

* cited by examiner

FIG. 6B

|  | Lattice parameter a (Å) |
|---|---|
| InP | 5.869 |
| ZnSe | 5.667 |
| ZnS | 5.405 |

SEMICONDUCTOR NANOCRYSTAL, AND METHOD OF PREPARING THE SAME

CROSS-REFERENCE TO RELATED APPLICATION

This application is a continuation of U.S. patent application Ser. No. 16/234,694, filed on Dec. 28, 2018, which is a continuation of U.S. patent application Ser. No. 14/039,788, filed on Sep. 27, 2013, and issued as U.S. Pat. No. 10,170,648, and claims priority to Korean Patent Application No. 10-2012-0119887, filed on Oct. 26, 2012, and all the benefits accruing to therefrom under 35 U.S.C. § 119, the contents of which in their entirety are herein incorporated by reference.

BACKGROUND

1. Field

A semiconductor nanocrystal and a method of preparing the same are disclosed.

2. Description of the Related Art

Semiconductor nanocrystals, which are also called quantum dots, have nano-sized particles with a crystalline structure and include hundreds to thousands of atoms.

The semiconductor nanocrystals are very small and thus have a large surface area per unit volume, and also provide a quantum confinement effect and the like. Accordingly, the semiconductor nanocrystals have unique physicochemical properties that differ from the inherent characteristics of a corresponding bulk semiconductor material.

In particular, the optoelectronic properties of the semiconductor nanocrystals may be tuned by controlling the size of the nanocrystals. Accordingly, new nanocrystals having improved properties and the use thereof in various applications are continuously sought.

SUMMARY

An embodiment provides a semiconductor nanocrystal having excellent light emitting properties and stability.

Another embodiment provides a method of preparing the semiconductor nanocrystal.

According to an embodiment, provided is a nanocrystal including a core including a Group III element and a Group V element; and a monolayer shell disposed on the surface of the core, the shell including a compound of the formula $ZnSe_xS_{(1-x)}$, wherein $0 \leq x \leq 1$, and wherein an average mole ratio of Se:S in the monolayer shell ranges from about 2:1 to about 20:1.

The core may be a binary element compound selected from GaN, GaP, GaAs, GaSb, AlN, AlP, AlAs, AlSb, InN, InP, InAs, and InSb, a ternary element compound selected from GaNP, GaNAs, GaNSb, GaPAs, GaPSb, AlNP, AlNAs, AlNSb, AlPAs, AlPSb, InNP, InNAs, InNSb, InPAs, InPSb, GaAlNP, AlGaN, AlGaP, AlGaAs, AlGaSb, InGaN, InGaP, InGaAs, InGaSb, AlInN, AlInP, AlInAs, and AlInSb, a quaternary element compound selected from GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, and InAlPSb. A combination including at least one of the foregoing may be used.

In an embodiment, the core may include InP.

The core may further include a Group II metal.

The Group II metal may be selected from Zn, Cd, Hg, Mg, and a combination thereof.

For example, when the core includes a Group II metal, the core may be InZnP.

In the nanocrystal, a mole ratio of Se:S in the monolayer shell ranges from about 3:1 to about 10:1.

The nanocrystal may further include at least one additional monolayer on the monolayer shell.

The additional monolayers may include about two or more, for example, about 3 or more, or about 4 or more monolayers.

The about two or more additional monolayers may have a Se:S concentration ratio gradient among the additional monolayers.

For example, the gradient can be a decreasing gradient with a gradually higher concentration of S or a gradually lower concentration of Se from the additional monolayer closest to the core to the additional monolayer farthest away from the core.

In an embodiment, the nanocrystal may include a ZnS layer as an outermost layer.

Alternatively, the gradient can include an increasing gradient with a gradually higher concentration of Se or a gradually lower concentration of S from the additional monolayer closest to the core to an additional monolayer farther from the core, and a decreasing gradient with a gradually higher concentration of S or a gradually lower concentration of Se from the additional monolayer farther from the core to the additional monolayer farthest away from the core such that the concentration of Se may be lower than that of S.

In an embodiment, the nanocrystal may also include a ZnS layer as an outermost layer.

The nanocrystal according to an embodiment may have a full width at half maximum of less than or equal to about 45 nm.

The nanocrystal may have a luminous efficiency, QY, of greater than or equal to about 70%, specifically greater than or equal to about 80%, or more specifically about 90%.

The nanocrystal may have a diameter of greater than or equal to about 6 nm, for example, greater than or equal to about 7 nm, or greater than or equal to about 8 nm.

The nanocrystal may have a light emitting region of about 500 to about 750 nm.

According to another embodiment, a method of preparing a nanocrystal including a core including a Group III element and a Group V element, and a monolayer shell formed on a surface of the core, the method including providing a nanocrystal core including a Group III element and a Group V element, and contacting the nanocrystal core with a precursor of Zn, Se and S to form a monolayer shell on a surface of the nanocrystal core and prepare the nanocrystal, wherein the precursor of Zn, Se, and S is present in an amount such that an average mole ratio of Se:S in the monolayer shell ranges from about 2:1 to about 20:1.

In the method, the Zn, Se, and S precursors are present in a mole ratio ranging from about 1:2 to about 60:1 to form the monolayer shell having a Se:S mole ratio of from about 2:1 to about 20:1.

The core may further include a Group II metal.

In the method, at least one additional monolayer may be further formed on the ZnSeS monolayer shell.

The additional monolayer may be formed by introducing an additional Se and S precursor. In addition, the additional monolayer may be formed by introducing additional Se, S, and Zn precursors.

The number of additional monolayers may be more than one.

The more than one additional monolayers may be formed by introducing additional Se and S precursors with a mole ratio of the Se and S precursors such that Se and S may have a concentration ratio gradient among the additional monolayers. In addition, the more than one additional monolayer may be formed by introducing additional Zn, Se, and S precursors in a mole ratio such that Se and S may have a concentration ratio gradient among the additional monolayers.

For example, the gradient can be a decreasing gradient with a gradually higher concentration of S or a gradually lower concentration of Se from the additional monolayer closest to the core to the additional monolayer farthest away from the core.

Alternatively, the gradient gradually includes an increasing gradient with a gradually higher concentration of Se or a gradually lower concentration of S from the additional monolayer closest to the core to an additional monolayer farther from the core, and a decreasing gradient with a gradually higher concentration of S or a gradually lower concentration of Se from the additional monolayer farther from the core to the additional monolayer farthest away from the core such that the concentration of Se may finally be lower than that of S.

The method may further include formation of a ZnS layer as an outermost layer.

The ZnS outermost layer may be formed by introducing an additional S precursor or additional S and Zn precursors.

According to another embodiment, a light emitting device including the nanocrystal according to the above embodiment is provided.

The light emitting device may be a display, a sensor, a photodetector, a solar cell, a hybrid composite, or a bio-labeling device.

In accordance with an embodiment, a nanocrystal including a core and having improved stability, luminescence efficiency, and full width at half maximum ("FWHM") is obtained.

The method of preparing the nanocrystal in accordance with the embodiments is highly reproducible.

BRIEF DESCRIPTION OF THE DRAWINGS

A description of the figures, which are meant to be exemplary and not limiting, is provided in which:

FIGS. 3A to 3C is a Transmission Electron Microscope ("TEM") photograph showing the nanocrystals prepared according to Preparation Example 1, Comparative Example 3, and Example 4, wherein FIG. 3A is a TEM photograph of the InZnP core according to Preparation Example 1, FIG. 3B is a TEM photograph of the InZnP/ZnS nanocrystal according to Comparative Example 3, and FIG. 3C is a TEM photograph of the InZnP/ZnSeS nanocrystal according to Example 4;

FIGS. 6A and 6B provides in FIG. 6A a graph schematically showing a bandgap difference among InP, ZnSe, and ZnS, and in FIG. 6B a table showing each lattice constant of the InP, ZnSe, and ZnS;

DETAILED DESCRIPTION

Figure 1A:
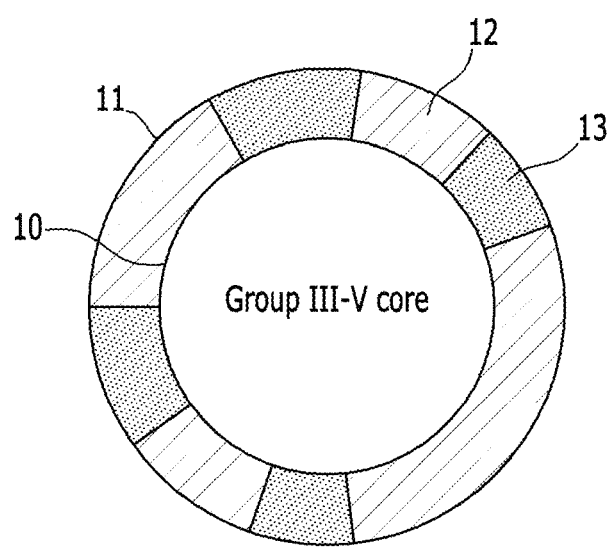
FIGS. 1A and 1B are schematic views of an exemplary embodiment of a nanocrystal including a ZnSeS monolayer shell formed on a Group III-V core, wherein FIG. 1A schematically and exaggeratively shows that ZnSe is non-uniformly bonded with ZnS to form a shell layer on the core, and FIG. 1B schematically shows that the ZnSe and ZnS uniformly form the shell layer on the core.

This disclosure will be more fully described hereinafter in the following detailed description, in which some but not all embodiments of this disclosure are described.

This disclosure may be embodied in many different forms and is not be construed as limited to the embodiments set forth herein; rather, these embodiments are provided so that this disclosure will fully convey the scope of the disclosure to those skilled in the art.

In the drawings, the thickness of layers, films, panels, regions, etc. are exaggerated for clarity.

It will be understood that when an element such as a layer, film, region, or substrate is referred to as being "on" another element, it can be directly on the other element or an intervening element may also be present. In contrast, when an element is referred to as being "directly on" another element, there is no intervening element present.

As used herein, the term "combination thereof" refers to a mixture, a stacked structure, a composite, an alloy, a blend, a reaction product, or the like.

The terminology used herein is for the purpose of describing particular embodiments only and is not intended to be limiting. As used herein, the singular forms "a," "an" and "the" are intended to include the plural forms as well, unless the context clearly indicates otherwise. The term "or" means "and/or." As used herein, the term "and/or" includes any and all combinations of one or to more of the associated listed items. Expressions such as "at least one of," when preceding a list of elements, modify the entire list of elements and do not modify the individual elements of the list.

It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which this general inventive concept belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

As used herein, the term "Group III-V core" refers to a core comprising a Group III element and a Group V element. A Group III-V core may be a binary element compound, a ternary element compound, a quaternary element compound or a combination thereof.

"Group" refers to a Group of the Periodic Table of the Elements.

According to an embodiment, a nanocrystal includes
a core 10, e.g., a Group III-V core; and
a monolayer shell 11, e.g., a ZnSeS monolayer (1 monolayer) shell, disposed on the surface of the core, the shell comprising a compound of the formula $ZnSe_xS_{(1-x)}$, wherein $0 \leq x \leq 1$, and
wherein an average mole ratio of Se:S in the monolayer shell ranges from about 2:1 to about 20:1.

In an embodiment, the mole ratio of Se:S in the ZnSeS monolayer on the surface of the core may range from about 3:1 to about 10:1, from about 3:1 to about 9:1, from about 3:1 to about 8:1, or from about 4:1 to about 10:1.

The Group III-V core may be a binary element compound selected from GaN, GaP, GaAs, GaSb, AlN, AlP, AlAs, AlSb, InN, InP, InAs, and InSb, a ternary element compound selected from GaNP, GaNAs, GaNSb, GaPAs, GaPSb, AlNP, AlNAs, AlNSb, AlPAs, AlPSb, InNP, InNAs, InNSb, InPAs, InPSb, GaAlNP, AlGaN, AlGaP, AlGaAs, AlGaSb, InGaN, InGaP, InGaAs, InGaSb, AlInN, AlInP, AlInAs, and AlInSb, a quaternary element compound selected from GaAlNAs, GaAlNSb, GaAlPAs, GaAlPSb, GaInNP, GaInNAs, GaInNSb, GaInPSb, InAlNP, InAlNAs, InAlNSb, InAlPAs, and InAlPSb, and a combination thereof.

In an embodiment, the Group III-V core may be an InP core.

The Group III-V core may include a Group II metal besides a Group III-V metal.

The Group II metal may be selected from Zn, Cd, Hg, Mg, and a combination thereof.

For example, when the Group III-V core includes a Group II metal, the core may be an InZnP core.

The nanocrystal may further include at least one ZnSeS monolayer on the ZnSeS monolayer shell.

The ZnSeS monolayer may include about 2 or more, for example, about 3 or more, or about 4 or more monolayers.

Herein, a monolayer is formed in which each ZnS or ZnSe molecule is bonded on the surface of the Group III-V core. In other words, no additional layer is formed by bonding additional ZnS or ZnSe molecules on the layer formed by consecutively bonding ZnS or ZnSe molecules on the core.

Figure 1B:
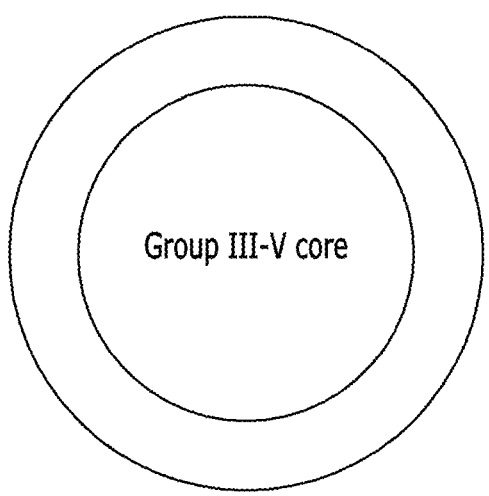

As illustrated in FIG. 1A, in an embodiment, ZnSe is non-uniformly bonded with ZnS, e.g., to provide a ZnSe portion 12 and a ZnS portion 13, to form a shell layer on the core. In another embodiment, ZnSe and ZnS uniformly form the shell layer on the core, as illustrated in FIG. 1B.

Figure 2:
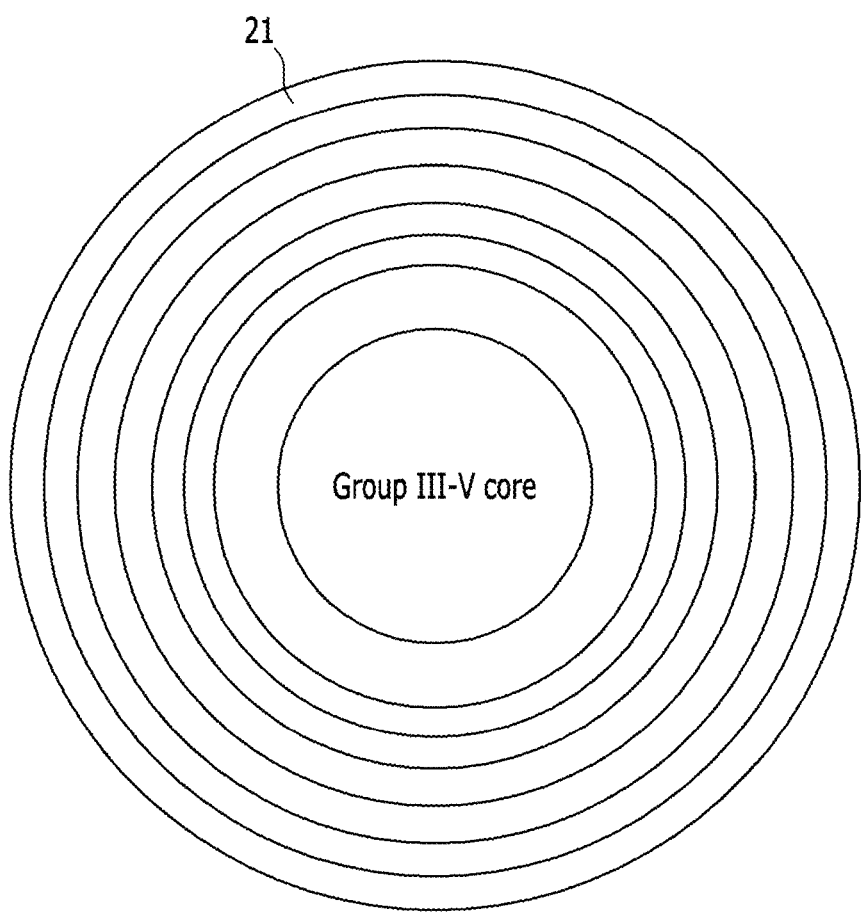
FIG. 2 is a schematic view of an exemplary embodiment of a nanocrystal including a shell having several ZnSeS monolayers in a concentration gradient on a Group III-V core.

When at least two additional ZnSeS monolayers are formed, as shown in FIG. 2, Se and S may have a concentration ratio gradient among the at least two additional ZnSeS monolayers.

The additional ZnSeS monolayers may gradually include S at a higher concentration than Se when the monolayers are farther away from the core. Accordingly, the nanocrystal may have a ZnS layer as an outermost layer 21.

Alternatively, the additional ZnSeS monolayers may gradually include Se in a higher concentration than S when the monolayers are farther away from the core first, but then include Se in a gradually lower concentration and the S in a gradually higher concentration after forming a predetermined number of ZnSeS monolayers.

For example, the Se is gradually included in a higher concentration ratio than the S until 1 to 2 additional monolayers are formed on the ZnSeS monolayer shell, but gradually in a lower concentration ratio from the third additional layer, while S is gradually included in a higher concentration forming a concentration gradient.

Recently, quantum dot (QD) nanocrystals having an energy band gap that is adjusted depending on size and composition and having excellent light emitting properties such as high color purity have drawn attention as a material that is variously applied in display, semiconductor, energy, and bio fields.

In particular, the quantum dot (QD) nanocrystals have been more applicable due to development of new synthesis technology for accomplishing high quality by adjusting size and shape, structure, uniformity, and the like in a colloid in a simple wet method.

In addition, the QD nanocrystals including conventional Cd containing nanocrystals have been reported to have excellent characteristics. However, since the Cd nanocrystals cause an environmental problem, an attempt to develop a material including no Cd has been made. As for the new material, a Group III-V nanocrystal has been researched. The precursors of Group III-V nanocrystals, however, are more sensitive to oxidation than those for CdSe-based QDs during synthesis and are deteriorated in activity, thus it is difficult to control synthesis using precursors of Group III-V nanocrystals. As for the Group III-V nanocrystal, InP/ZnS has been mostly researched, but often has efficiency of less than or equal to about 60%, a full width at half maximum (FWHM) of greater than or equal to about 40 nm, and a particle size ranging from about 2 to about 5 nm, and thus has lower light emitting properties than the conventional CdSe-based QD (referring to Nano Lett. 2012, 12, 3986., ACS nano, 2011, 5 12, 9392., Appl. Phys. Lett. 2012, 96, 073102., J. Phys. Chem. Lett. 2012, 3, 214.).

Accordingly, there is a need for development of a QD nanocrystal having higher quantum efficiency and higher color purity that can be applied to a photoelectron device, a sensor, or the like.

According to an embodiment, a nanocrystal has remarkably improved to luminous efficiency (QY) and full width at half maximum (FWHM). The nanocrystal also stably grows to have a QD size of greater than or equal to about 6 nm by forming a ZnSeS monolayer including Se:S in a mole ratio ranging from about 2:1 to about 20:1 on the surface of a Group III-V core, and then additional forming ZnSeS monolayers having a concentration ratio gradient thereon. For example, the additional monolayer may include S in a gradually higher concentration than the Se when the additional monolayer is farther away from the core.

In particular, the nanocrystal according to an embodiment may have a full width at half maximum of less than or equal to about 45 nm and luminous efficiency of greater than or equal to about 70%, specifically, greater than or equal to about 80%, or more specifically about 90%.

The nanocrystal may have a diameter of greater than or equal to 6 nm, for example, greater than or equal to about 7 nm or greater than or equal to about 8 nm.

The nanocrystal may have a light emitting region of about 500 to about 750 nm.

Seoul National University published an article (Chem. Mater. 2011, 23, 4459-4463) disclosing an InP/ZnSeS nanocrystal including Se:S in a mole ratio of 1:1.2 in a contact layer with a core but in a mole ratio of 1:7 farther from the core as a shell grows bigger.

However, a nanocrystal including a Group III-V core and a ZnSeS monolayer formed on the surface of the core and including Se:S in a mole ratio ranging from about 2:1 to about 20:1, for example, about 3:1 to about 10:1 according to an embodiment of the present disclosure may have much better light emitting properties than the one disclosed in the Chem. Mater. by forming additional ZnSeS monolayers thereon.

Specifically, the nanocrystal may stably grow by forming additional ZnSeS monolayers on the ZnSeS monolayer shell formed on the surface of the core and having Se:S in a predetermined concentration ratio. Herein, the additional ZnSeS monolayers include Se and S with a concentration ratio gradient farther from the core. Accordingly, the nanocrystal has much better light emitting properties than QY<50% and full width at half maximum (FWHM) of 70 nm published in Chem. Mater.

The concentration gradient between Se and S among the additional ZnSeS monolayers does not necessarily mean that S is in a higher concentration and Se is in a lower concentration when the monolayer is farther away from the core. The additional ZnSeS monolayers may have the Se in a higher concentration up to a predetermined size and then the S in a higher concentration.

In other words, the nanocrystal including a Group III-V core and a ZnSeS monolayer formed on the surface of the core and including Se:S in a ratio ranging from about 2:1 to about 20:1 according to an embodiment of the present disclosure may maintain a predetermined ratio of Se:S in the monolayer, which may further stabilize additionally-formed ZnSeS monolayers thereon and secure excellent light emitting properties.

According to an embodiment, the nanocrystal may be prepared by forming a Group III-V nanocrystal core and then a ZnSeS monolayer including Se:S in a ratio ranging from about 2:1 to about 20:1 on the surface of the core.

Another embodiment of the present disclosure provides a method of preparing the nanocrystal including a Group III-V core and a ZnSeS shell formed on a surface of a ZnSeS shell, including preparing a Group III-V nanocrystal core, and forming a ZnSeS monolayer shell from precursors of Zn, Se and S on the surface of the nanocrystal core, wherein the Zn, Se, and S precursors are present in such amounts that the ZnSeS monolayer shell includes Se:S in a mole ratio ranging from about 2:1 to about 20:1.

The ZnSeS monolayer including Se:S in a mole ratio ranging from about 2:1 to about 20:1 on the Group III-V core is formed by introducing Se and S precursors in a ratio ranging from about 1:2 to about 60:1.

Since the S precursor has less reactivity than the Se precursor, the ZnSeS monolayer on the surface of the Group III-V core may maintain at least a mole ratio of about 2:1 between Se:S despite introducing the Se and S precursors in a ratio of 1:2.

Accordingly, in order to prepare the nanocrystal according to the embodiment of the present disclosure, the Se and S precursors for preparing the ZnSeS monolayer on the surface of a Group III-V core may be present in a mole ratio ranging from about 1:2 to about 60:1.

The method may further include, for example, additional formation of at least two ZnSeS monolayers on the Group III-V core and the ZnSeS monolayer shell.

The additional formation of at least two ZnSeS monolayers may include introduction of additional Se and S precursors. The Se and S precursors may be introduced by adjusting their mole ratio to form a concentration gradient between Se and S among the additional monolayers. In addition, the additional formation of at least two ZnSeS monolayers may include introduction of additional Zn, Se, and S precursors by adjusting their mole ratio to form a concentration ratio gradient between Se and S among the additional monolayers.

The gradient gradually includes S in a higher concentration than Se farther from the core. Accordingly, the method may further include formation of a ZnS layer as an outermost layer.

Alternatively, the gradient gradually includes Se in a higher concentration than S father from the core up to a predetermined layer, but then Se in a gradually lower concentration. Accordingly, the method may further include formation of a ZnS layer as an outermost layer.

The ZnS outermost layer may be formed by sequentially introducing an S precursor, or S precursor along with Zn precursor on the nanocrystal including the Group III-V core and the ZnSeS monolayer formed on the surface of the core.

According to an embodiment, the method of preparing a nanocrystal may be performed by sequentially forming at least two ZnSeS monolayers on the surface of a Group III-V core after forming the Group III-V core in one reactor. Herein, the additional ZnSeS monolayers are formed by sequentially introducing Se, S, and/or Zn precursors into the same reactor.

However, the method does not need to be sequentially performed in one reactor, but may be performed by separating it from one reactor after preparing a nanocrystal with a predetermined size in the reactor and then forming an additional monolayer thereon in another reactor if necessary. In other words, each additional monolayer is formed in each different reactor by separating a nanocrystal from one reactor after forming it in the former reactor. This additional layer coating process may be repeated several times.

According to the embodiment of the present disclosure, the process may have high reproducibility. As shown in Examples 4 and 5 described herein, a nanocrystal formed by sequentially forming ZnSeS monolayers on the surface of a Group III-V core and another nanocrystal formed by separating it after growing to a predetermined size and forming additional ZnS layers may have excellent light emitting properties and stable growth.

On the other hand, a ZnS shell may be easily formed on a Group III-V core, specifically, an InP core or an InZnP core with high efficiency according to an embodiment of the present disclosure as shown in Example 5. The Group II-VI ZnS shell may be formed on the Group III-V InP core. However, it is hard to stably form a nanocrystal having the core-shell structure. The reason is that InP used as the core and ZnS used as the shell have a large lattice constant difference, as shown in FIG. 6B. However, when ZnSeS is formed by including Se in a higher ratio toward the core and S in a higher ratio toward the outer layer, a uniform and thick shell is formed by decreasing the lattice constant difference. As a result, the nanocrystal has a decreased full width at half maximum and improved luminous efficiency and stability.

Figure 3A:
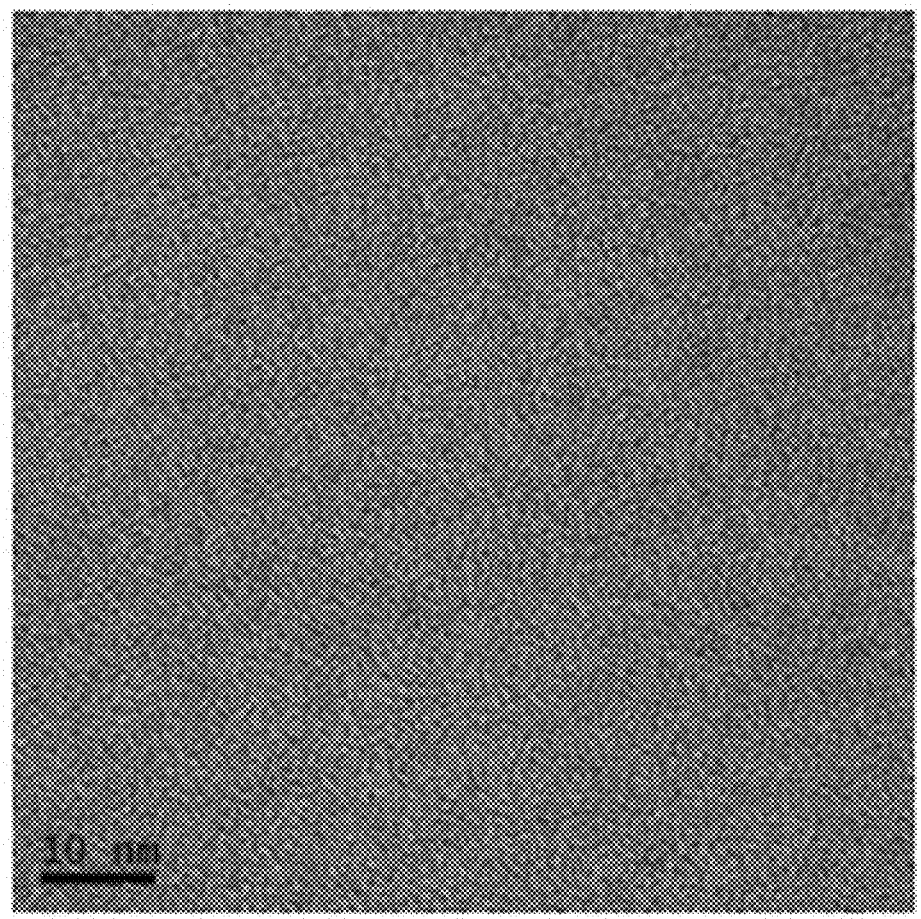
Figure 3B:
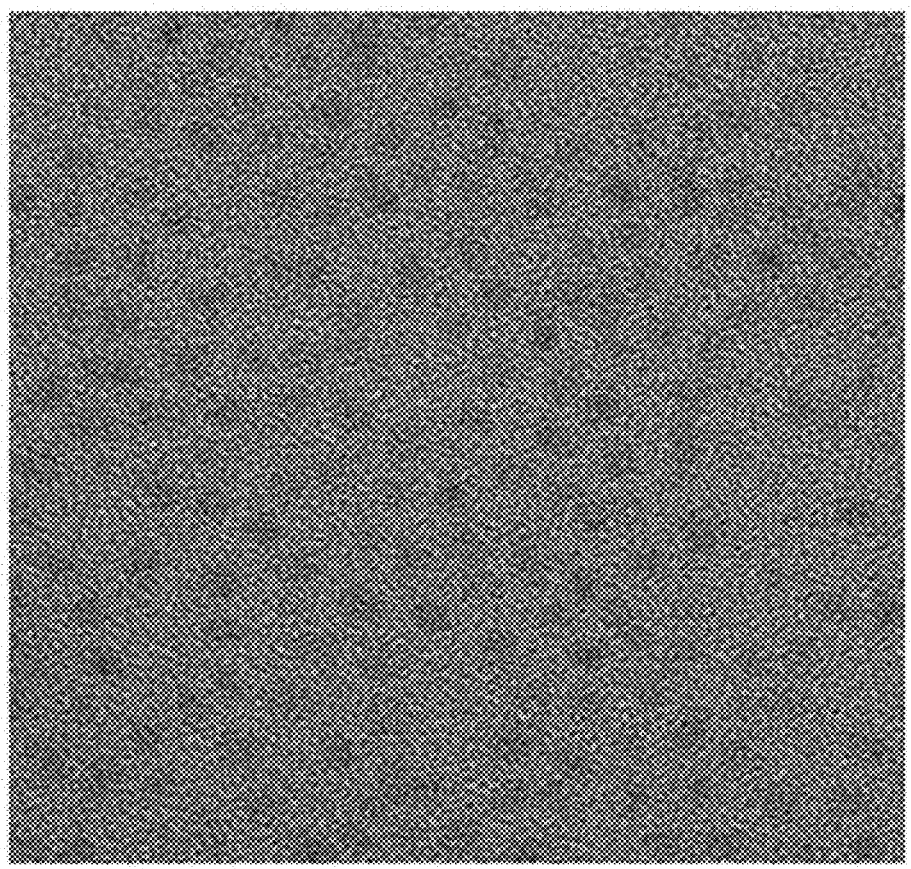
Figure 3C:
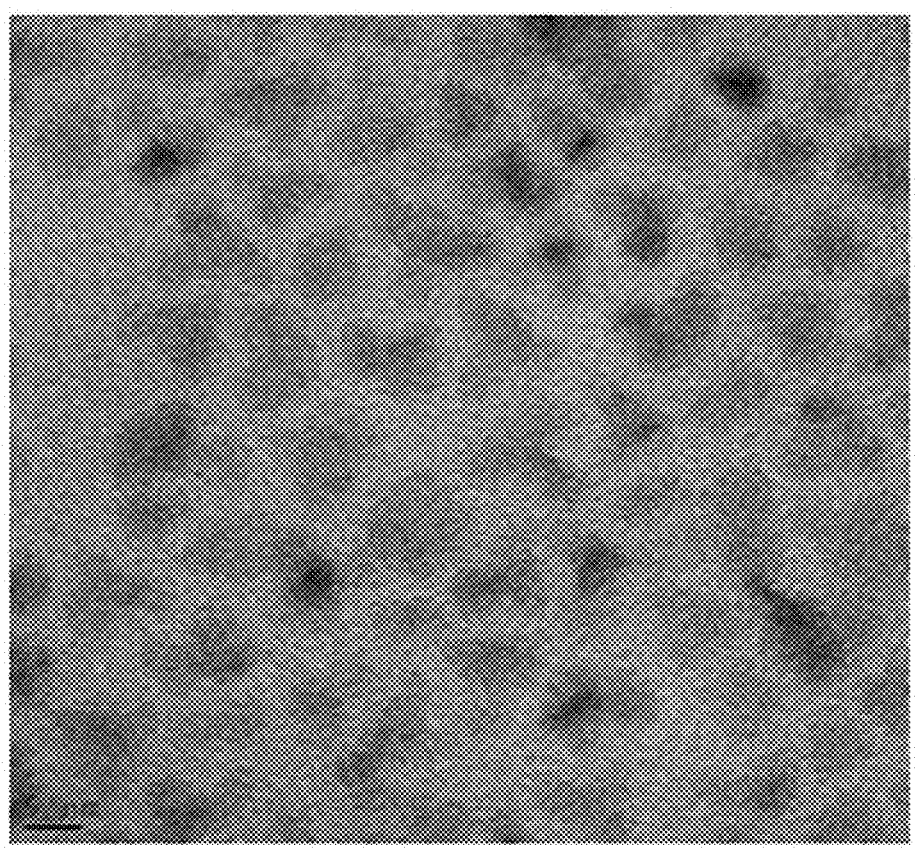
Figure 4:
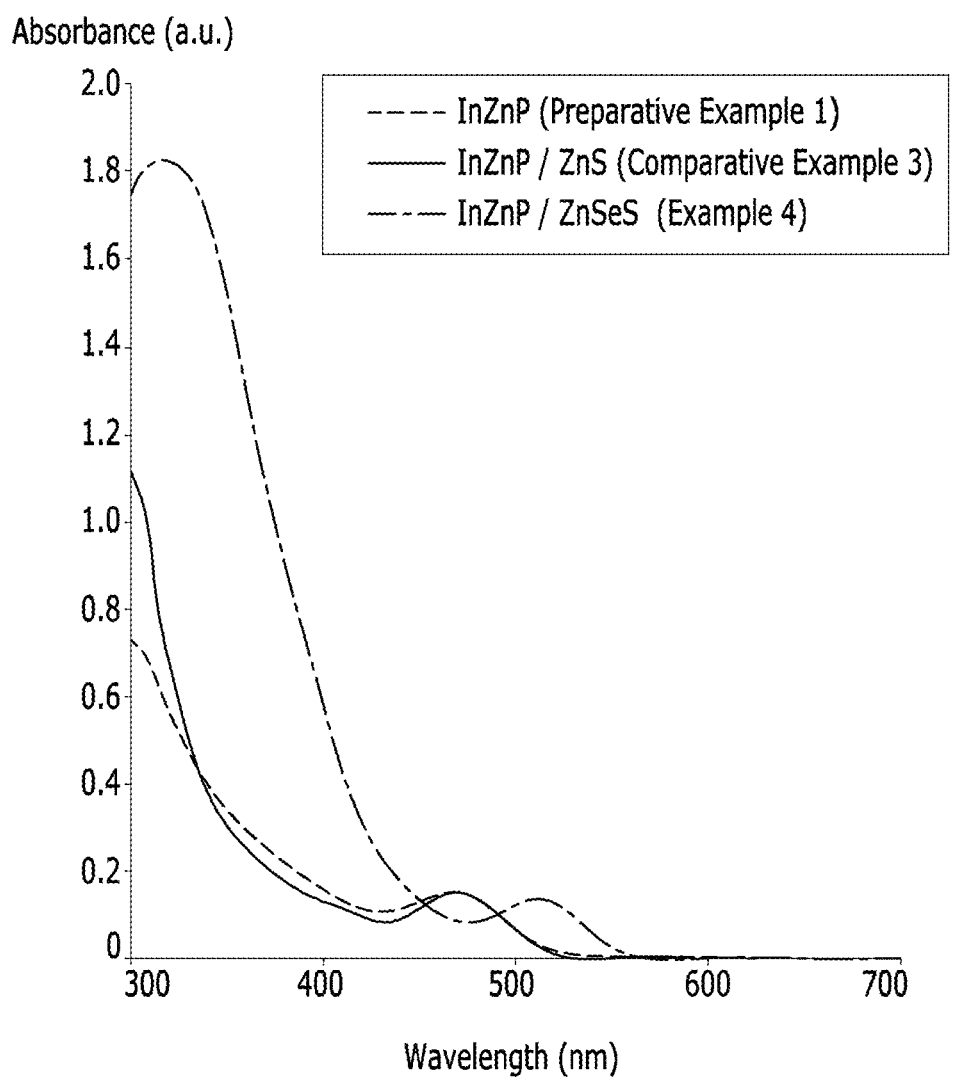
FIG. 4 is a graph of absorbance (arbitrary units, a.u.) versus wavelength (nanometers, nm) showing absorbance of the InZnP nanocrystal core according to Preparation Example 1, the InZnP/ZnS nanocrystal according to Comparative Example 3, and the InZnP/ZnSeS nanocrystal according to Example 4.
Figure 5:
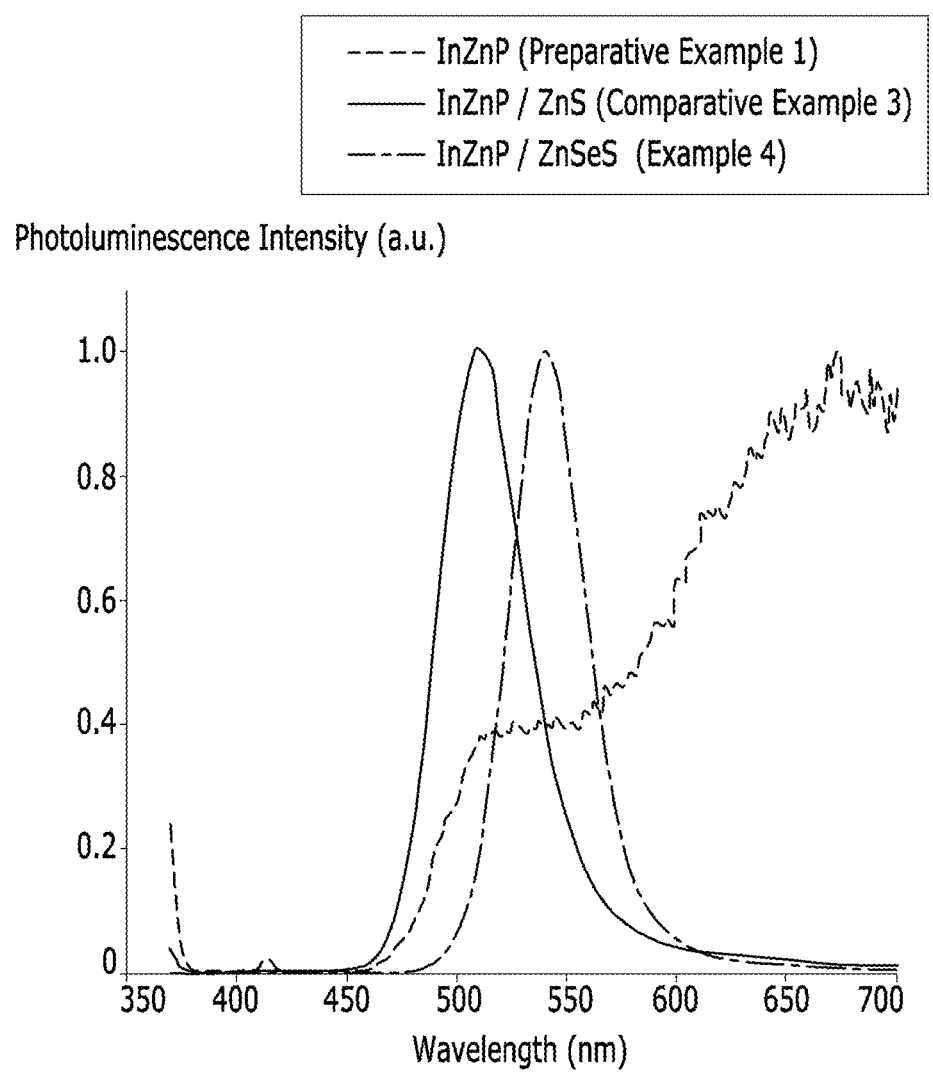
FIG. 5 is a graph of photoluminescence ("PL") intensity (arbitrary units, a.u.) versus wavelength (nanometers, nm) showing light emitting properties of the InZnP nanocrystal core according to Preparation Example 1, the InZnP/ZnS nanocrystal according to Comparative Example 3, and the InZnP/ZnSeS nanocrystal according to Example 4.

These results are provided in FIGS. 3 to 5.

FIGS. 3A to 3C are a TEM photographs showing the nanocrystals prepared according to Preparation Example 1, Comparative Example 3, and Example 4, wherein FIG. 3A is a TEM photograph showing the InZnP core prepared in Preparation Example 1, FIG. 3B is a TEM photograph showing the InZnP/ZnS nanocrystal prepared in Comparative Example 3, and FIG. 3C is a TEM photograph showing the InZnP/ZnSeS nanocrystal prepared in Example 4.

FIG. 4 is a graph showing absorbance of the InZnP nanocrystal core according to Preparation Example 1, the InZnP/ZnS nanocrystal according to Comparative Example 3, and the InZnP/ZnSeS nanocrystal according to Example 4.

FIG. 5 is a graph showing photoluminescence intensity of the InZnP nanocrystal core according to Preparation Example 1, the InZnP/ZnS nanocrystal according to Comparative Example 3, and the InZnP/ZnSeS nanocrystal according to Example 4.

As shown in FIGS. 3 to 5, the InZnP/ZnSeS nanocrystal (FIG. 3C) according to Example 4 has a much bigger particle size than an InZnP/ZnS nanocrystal (FIG. 3B).

In addition, the InZnP/ZnSeS nanocrystal according to Example 4 has excellent luminous efficiency and decreased full width at half maximum compared with the InZnP/ZnS nanocrystal according to Comparative Example 3 based on FIGS. 4 and 5.

Figure 7:
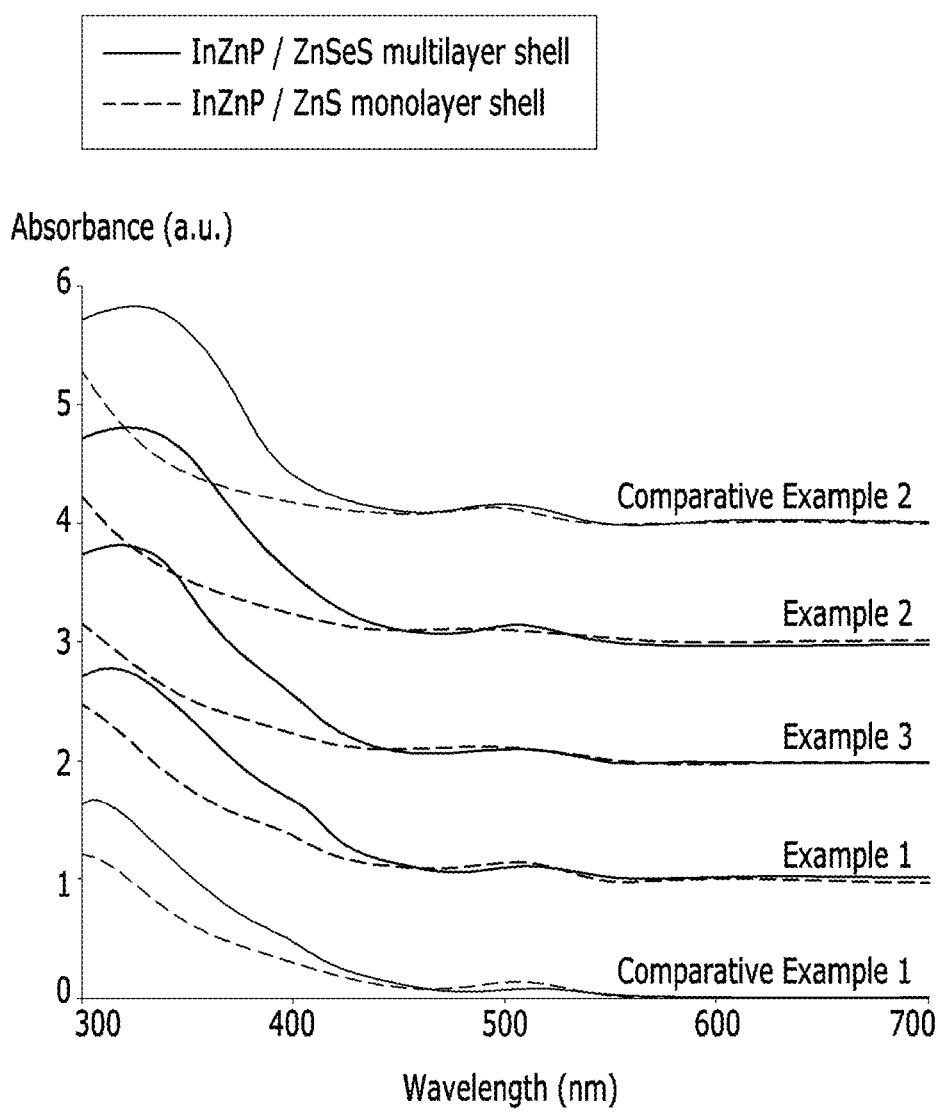
FIG. 7 is a graph showing absorbance (arbitrary units, a.u.) versus wavelength (nanometers, nm) of the nanocrystals including a ZnSeS or ZnS monolayer shell formed on an InP core, the nanocrystals further including a ZnSeS monolayer shell on the aforementioned nanocrystals according to Examples 1 to 3 and Comparative Examples 1 and 2.
Figure 8:
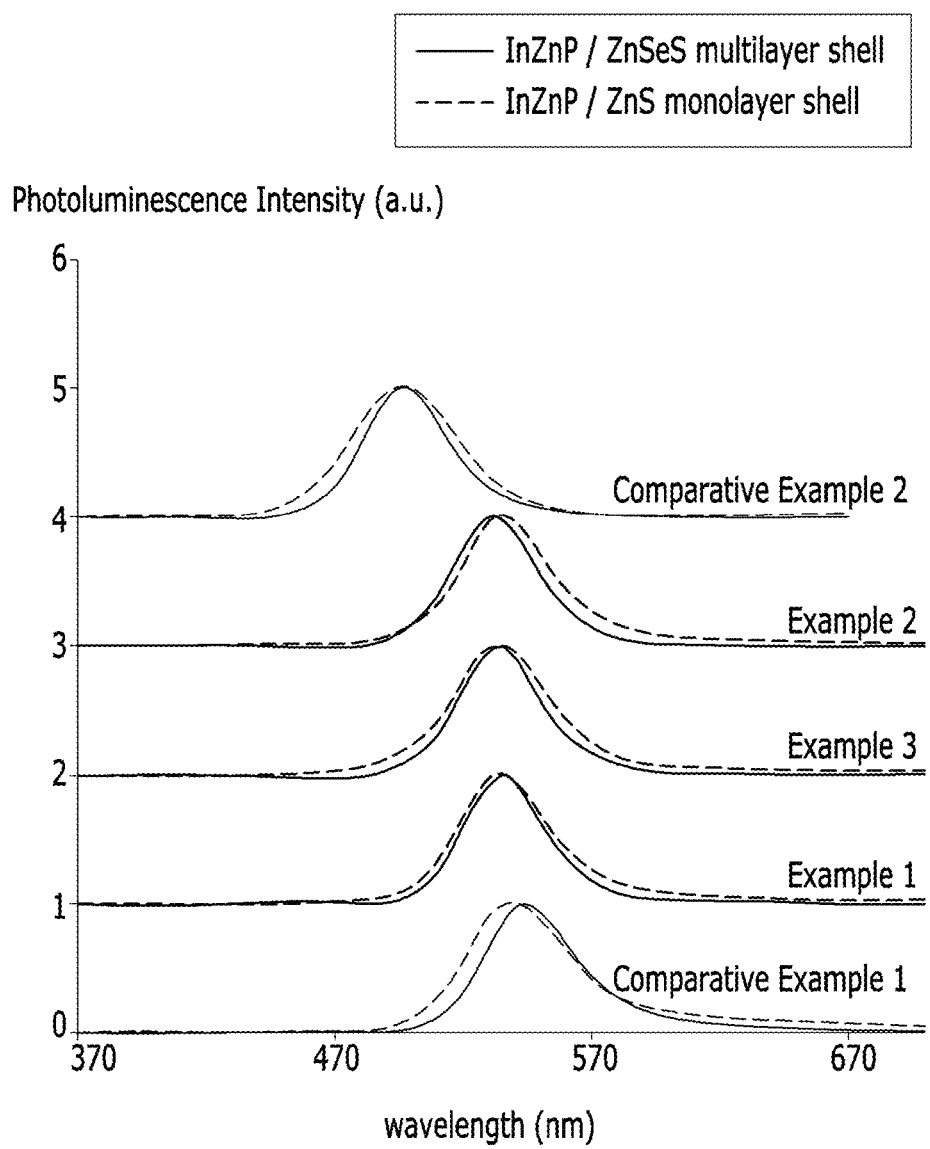
FIG. 8 is a graph of photoluminescence intensity (arbitrary units, a.u.) versus wavelength (nanometers, nm) showing light emitting properties of the nanocrystals including a ZnSeS or ZnS monolayer shell formed on an InP core, the nanocrystals further including a ZnSeS monolayer shell on the aforementioned nanocrystal according to Examples 1 to 3 and Comparative Examples 1 and 2.

FIGS. 7 and 8 are graphs showing absorbance and light emitting properties of the nanocrystal including a ZnSeS or ZnS monolayer on an InP core and the nanocrystal further including a ZnSeS monolayer shell on the aforementioned nanocrystal according to Examples 1 to 3 and Comparative Examples 1 and 2.

Figure 9:
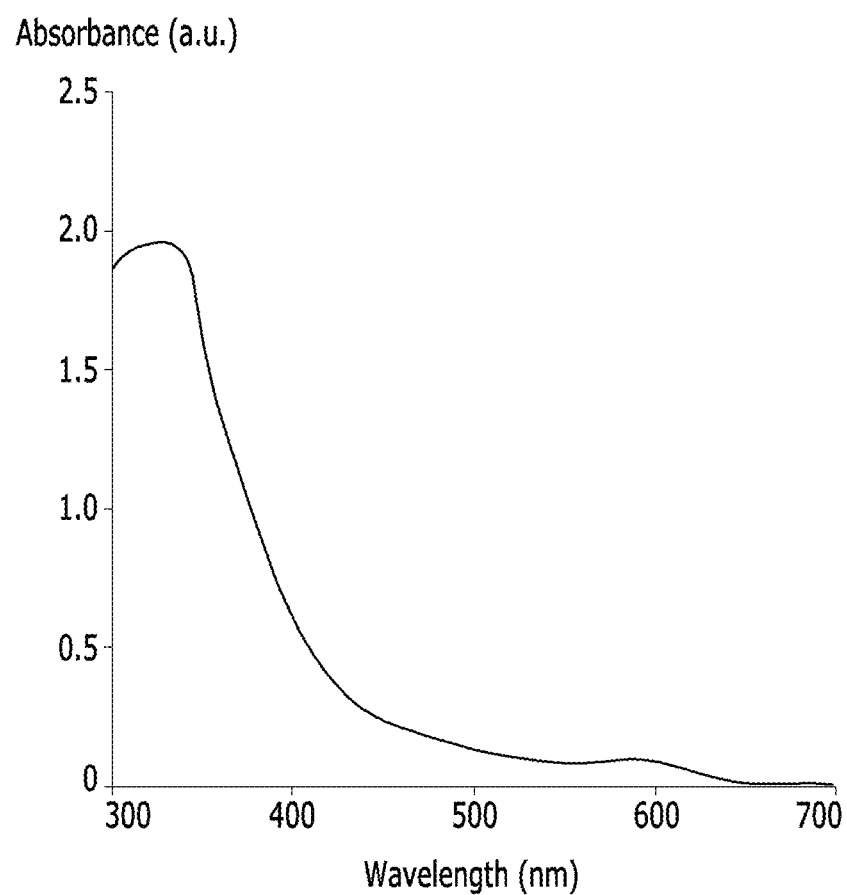
FIG. 9 is a graph of absorbance (arbitrary units, a.u.) versus of wavelength (nanometers, nm) showing absorbance of the nanocrystal according to Example 7.
Figure 10:
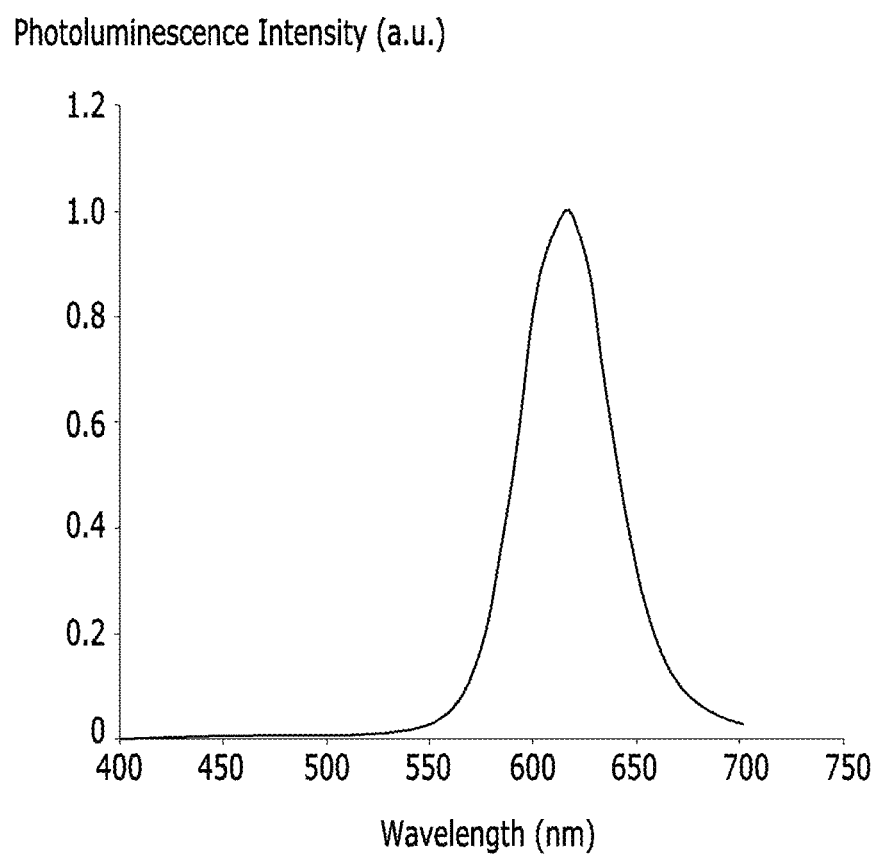
FIG. 10 is a graph of photoluminescence intensity (arbitrary units, a.u.) versus wavelength (nanometers, nm) showing light emitting properties of the nanocrystal according to Example 7.

Referring to FIG. 8, the nanocrystals including Se:S in the monolayer within the ratio according to the present disclosure and the nanocrystals including an additional ZnSeS monolayer on the monolayer according to Examples 1 to 3 have excellent light emitting properties compared with the nanocrystals including Se:S that falls outside of the ratio of the present disclosure (Comparative Examples 1 and 2). FIGS. 9 and 10 are graphs showing absorbance and PL light emitting properties of the InP/ZnSeS/ZnS nanocrystal including an InP core, a shell formed of a plurality of ZnSeS monolayers, and a ZnS layer as an outermost layer according to an exemplary embodiment of the present disclosure.

Based on these graphs, the nanocrystal having a plurality of ZnSeS monolayers as a shell on the InP core and a ZnS shell layer as an outermost layer according to the embodiment of the present disclosure has excellent light emitting properties compared with a nanocrystal having a ZnS shell layer directly formed on an InP core like Comparative Example 3.

Without being bound to a specific theory, the nanocrystal according to the embodiment of the present disclosure includes a ZnSeS intermediate shell layer including a predetermined ratio between Se:S to decrease a lattice constant difference between the InP core and the ZnS shell as schematically shown in FIG. 6, and thus may more stably grow.

According to an embodiment, the nanocrystal may be easily formed in a colloid wet process that is well known for manufacturing a nanocrystal.

In other words, the colloid wet process may be used to form a Group III-V core and a ZnSeS monolayer on the surface of the core, except that it includes Se and S within the ratio according to the embodiment of the present disclosure.

In addition, when additional ZnSeS monolayers are formed on the surface of the nanocrystal, the colloid wet process may be used to form the additional ZnSeS monolayers except that the ratio of Se:S is adjusted in the additional ZnSeS monolayers.

The colloid wet process for forming a nanocrystal is well known to those who have common knowledge in a related art and will not be illustrated in detail.

According to another embodiment, a light emitting device including the nanocrystal according to the above embodiment is provided.

The light emitting device may be a display, a sensor, a photodetector, a solar cell, a hybrid composite, a biolabeling device, and the like.

Hereinafter, the present disclosure is illustrated in more detail with reference to examples. However, they are exemplary embodiments of the present disclosure, and the present disclosure is not limited thereto.

EXAMPLES

Preparation Example 1: Preparation of InZnP Core 0.2 mmol (0.058 g) of indium acetate, 0.125 mmol (0.0183 g) of zinc acetate, 0.8 mmol (0.204 g) of palmitic acid, and 10 mL of 1-octadecene are added to a flask and vacuum-treated at 120° C. for 1 hour. The mixture is heated up to 280° C. after nitrogen ($N_2$) is introduced into the flask. The reaction temperature is set at 280° C. for stabilization, and a mixed solution of 0.15 mmol (43 μL) of tris(trimethylsilyl)phosphine and 1 mL of trioctyl phosphine ("TOP") are rapidly added thereto. The resulting mixture is reacted for 10 minutes. The reactant is rapidly cooled down, centrifuged with acetone, and then dispersed in toluene. The obtained nanocrystal (QD) has a UV first absorption maximum ranging from 440 to 460 nm.

Preparation Example 2: Preparation of InP Core 0.2 mmol (0.058 g) of indium acetate, 0.6 mmol (0.154 g) of palmitic acid, and 10 mL of 1-octadecene are added to a flask and vacuum-treated at 120° C. for one hour. The mixture is heat-treated up to 280° C. after introducing nitrogen ($N_2$) into the flask. When the reactant is stabilized by setting the reaction temperature at 280° C., a mixed solution of 0.1 mmol (29 μL) of tris(trimethylsilyl)phosphine and 0.5 mL of TOP is rapidly added thereto. The resulting mixture is reacted for 40 minutes. In addition, 0.2 mmol (0.058 g) of indium acetate, 0.6 mmol (0.154 g) of palmitic acid, and 4 mL of 1-octadecene are added to another flask, vacuum-treated at 120° C. for 1 hour, and cooled down to 50° C. After introducing nitrogen ($N_2$) into the flask, a mixed solution of 0.1 mmol (29 μL) of tris(trimethylsilyl) phosphine and 0.5 mL of TOP is added to the first InP mixed solution in a dropwise fashion for 15 minutes. The resulting mixture is further reacted for 10 minutes.

a composition of the following Table 1, and the mixture is reacted for 20 minutes again. Then, a mixed solution of Se and S is prepared in a different ratio, injected into the reactor, and reacted for 20 minutes. Various mixed solutions of 0.01 mmol of Se/TOP+0.08 mmol of S/TOP, 0.01 mmol of Se/TOP+0.12 mmol of S/TOP, and 0.01 mmol of Se/TOP+ 0.15 mmol of S/TOP are sequentially used.

When the reaction is complete, the reactor is cooled down, and the obtained nanocrystal is centrifuged with ethanol and dispersed in toluene.

The nanocrystal is measured regarding the PL characteristic of having a ZnSeS multi-layered shell on an InZnP core. The result is provided in Table 1.

TABLE 1

| | Se:S ratio of in a ZnSeS monolayer | Composition ratio of reactants (Zn:Se:S) | PL characteristic of a monolayer structure: light emitting wavelength (full width at half maximum) luminous efficiency | PL characteristic of a multi-layer structure: light emitting wavelength (full width at half maximum) luminous efficiency |
|---|---|---|---|---|
| Comparative Example 1 | 1:0 | 1:1.83:0 | 540 (48) 15% | 544 (44) 39% |
| Example 1 | 12:1 | 1:0.1:0.033 | 534 (41) 41% | 536 (38) 70% |
| Example 2 | 9:1 | 1:0.067:0.033 | 535 (42) 31% | 533 (39) 78% |
| Example 3 | 5:1 | 1:0.067:0.067 | 535 (43) 47% | 535 (39) 70% |
| Comparative Example 2 | 1:1 | 1:0.033:0.1 | 527 (49) 55% | 531 (46) 40% |

The obtained InP nanocrystal (QD) has a UV first absorption maximum ranging from 565 to 575 nm.

Examples 1 to 3 and Comparative Examples 1 and 2: Preparation of a nanocrystal including an InZnP core and a ZnSeS monolayer shell, preparation of a nanocrystal including an InZnP core and a ZnSeS multi-layered shell, and light-emitting properties of the nanocrystals.

Nanocrystals respectively including a ZnSeS monolayer and multi-layered shells on the surface of the nanocrystal core according to Preparation Example 1 are formed.

Specifically, 0.3 mmol (0.056 g) of zinc acetate, 0.6 mmol (0.189 g) of oleic acid, and 10 mL of trioctylamine are added to a flask and vacuum-treated at 120° C. for 10 minutes. The mixture is heated up to 220° C. after introducing nitrogen ($N_2$) into the flask. Next, the InZnP core according to Preparation Example 1 is added to the reactant within 10 seconds. Then, Se/TOP is slowly added thereto to have a composition in the following Table 1 related to the zinc acetate. The resulting mixture is heated up to 280° C. Then, S/TOP is added thereto to have a composition in the following Table 1. The resulting mixture is heated up to 320° C. and reacted for 20 minutes.

After the reaction, the resulting product is cooled down, obtaining nanocrystal. The nanocrystal is centrifuged with ethanol and dispersed in toluene.

The nanocrystal is measured regarding PL characteristic having a ZnSeS monolayer shell on an InZnP core. The result is provided in Table 1.

In addition, nanocrystals having a ZnSeS monolayer on an InZnP core having a ratio of Zn, Se, and S provided in the following Table 1 inside a ZnSeS monolayer shell are respectively formed in the same method as aforementioned. Then, additional ZnSeS layers are consecutively formed to form a ZnSeS multi-layered shell on the InZnP core.

In other words, a mixed solution of 0.01 mmol of Se/TOP and 0.05 mmol of S/TOP is slowly injected into a reactor including each nanocrystal having a monolayer shell having In addition, the nanocrystals respectively having a monolayer shell and a multi-layered shell are measured regarding UV absorbance and PL light emitting properties. The results are respectively provided in FIGS. 7 and 8.

In FIGS. 7 and 8, each dotted line shows the UV absorbance or PL light emitting properties of the nanocrystal having a monolayer shell, while each solid line shows the UV absorbance and PL light emitting properties of the nanocrystal having a multi-layered shell.

As shown in Table 1 and FIG. 8, when the Se and S in the first monolayer contacting the nanocrystal core has a ratio within the range according to an embodiment of the present disclosure, the nanocrystal having additional ZnSeS monolayers has improved light emitting properties, and particularly decreased full width at half maximum (FWHM).

Example 4: Preparation of Nanocrystal InZnP/ZnSeS Including InZnP

Core and ZnSeS Multi-Layered Shell 0.3 mmol (0.056 g) of zinc acetate, 0.6 mmol (0.189 g) of oleic acid, and 10 mL of trioctylamine are added to a flask and vacuum-treated at 120° C. for 10 minutes. The vacuum-treated mixture is heated up to 220° C. after introducing nitrogen ($N_2$) into the flask. Then, the InZnP core according to Preparation Example 1 is added thereto within 10 seconds, and 0.02 mmol of Se/TOP is slowly injected thereinto. The resulting mixture is heated up to 280° C. Next, 0.01 mmol of S/TOP is added thereto. The obtained mixture is heated up to 320° C. and reacted for 20 minutes. Consecutively, a mixed solution of 0.01 mmol of Se/TOP and 0.05 mmol of S/TOP is slowly injected thereto and reacted for 20 minutes again. Then, the same reaction is repeated for 20 minutes by switching the ratio between Se and S. The Se and S are mixed in a ratio of 0.01 mmol of Se/TOP+0.08 mmol of S/TOP, 0.01 mmol of Se/TOP+0.12 mmol of S/TOP, 0.01 mmol of Se/TOP+0.15 mmol of S/TOP, and 0.19 mmol of S/TOP. These mixed solutions are sequentially used.

When the reaction is complete, the reactor is cooled down, and the obtained nanocrystal is centrifuged with ethanol and dispersed in toluene.

The obtained nanocrystal (QD) has a UV first absorption maximum ranging from 510 to 515 nm, a PL emission peak ranging from 535 to 545 nm, a FWHM ranging from 38 to 44 nm, and QY ranging from 70 to 80%.

Example 5: Preparation of Nanocrystal InZnP/ZnSeS/ZnS Including

InZnP Core, ZnSeS Multi-Layered Shell, and ZnS Outermost Layer 0.3 mmol (0.056 g) of zinc acetate, 0.3 mmol (0.0947 g) of oleic acid, and 10 mL of trioctylamine are added to a flask and vacuum-treated at 120° C. for 10 minutes. The vacuum-treated mixture is heated up to 220° C. after introducing nitrogen ($N_2$) into the flask. Then, the nanocrystal InZnP/ZnSeS toluene solution according to Example 4 is added to the heated mixture within 10 seconds, and 6 mmol of S/TOP is slowly injected thereinto. The resulting mixture is heated up to 280° C. and reacted for 2 hours.

The obtained nanocrystal (QD) has a UV first absorption maximum ranging from 510 to 515 nm, a PL emission peak ranging from 535 to 545 nm, a FWHM ranging from 38 to 44 nm, and QY ranging from 70 to 90%.

Comparative Example 3: Preparation of Nanocrystal InZnP/ZnS

Including an InZnP Core and a ZnS Layer 0.3 mmol (0.056 g) of zinc acetate, 0.6 mmol (0.0947 g) of oleic acid, and 10 mL of trioctylamine are added to a flask and vacuum-treated at 120° C. for 10 minutes. The vacuum-treated mixture is heated up to 220° C. after introducing nitrogen ($N_2$) into the flask. Herein, the InZnP core according to Preparation Example 1 is added thereto within 10 seconds, and then 6 mmol of S/TOP is slowly injected thereinto. The resulting mixture is heated up to 300° C. and reacted for 1 hour.

When the reaction is complete, the reactor is cooled down, and the obtained nanocrystal is centrifuged with ethanol and dispersed in toluene.

This nanocrystal includes a ZnS layer on an InZnP core.

The InZnP/ZnS nanocrystal including no ZnSeS intermediate shell layer according to Comparative Example 3, the InZnP core according to Preparation Example 1, and the InZnP/ZnSeS nanocrystal according to Example 4 are measured regarding UV absorbance and light emitting properties. The results are respectively provided in FIGS. 4 and 5.

As shown in FIGS. 4 and 5, the nanocrystal including a monolayer having a Se:S ratio according to the embodiment of the present disclosure has higher absorbance than the nanocrystal including no monolayer according to Comparative Example 3, and thus has excellent QY luminous efficiency and a decreased full width at half maximum.

Figure 6A:
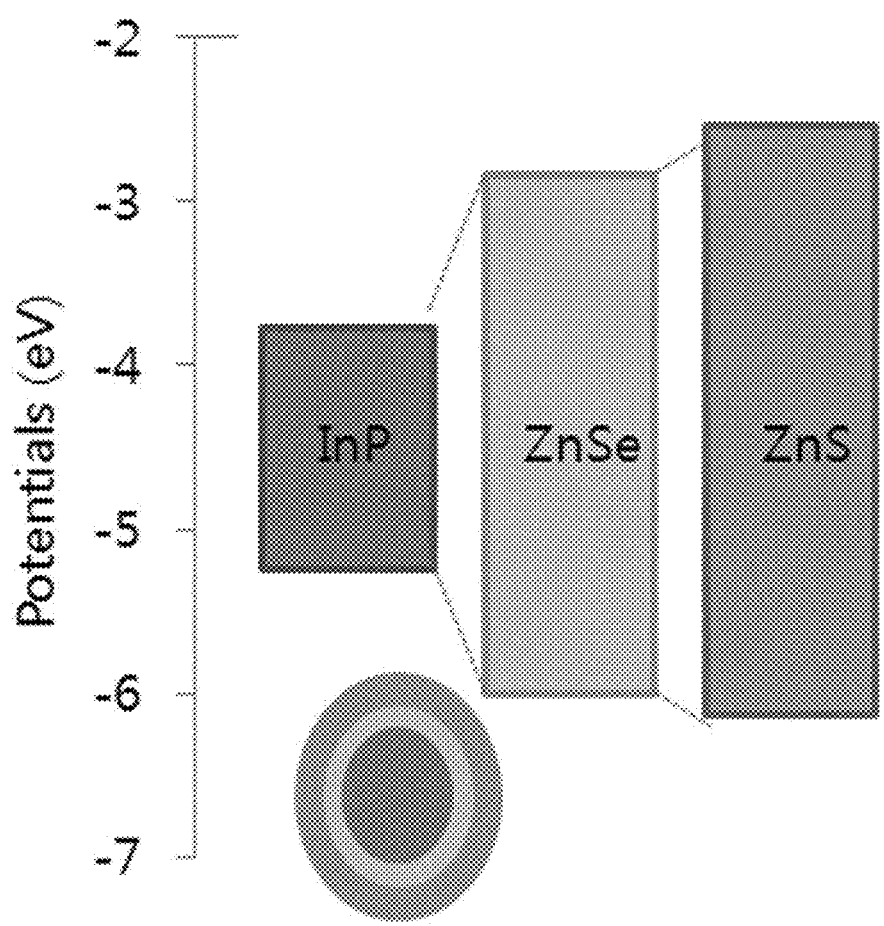

The InP/ZnS nanocrystal according to Comparative Example 3 has too large an energy band gap between the InP core and the ZnS shell to be formed. Thus, the nanocrystal does not have excellent light emitting properties, as schematically shown in FIG. 6A. On the other hand, the nanocrystal including a ZnSeS shell layer according to Example 4 has remarkably improved UV absorbance and PL light emitting properties.

Example 6: Preparation of InZnP/ZnSeS/ZnS Nanocrystal Having a Different Concentration Ratio Gradient 0.3 mmol (0.056 g) of zinc acetate, 0.6 mmol (0.189 g) of oleic acid, and 10 mL of trioctylamine are added to a flask and then vacuum-treated at 120° C. for 10 minutes. The vacuum-treated mixture is heated up to 220° C. after introducing nitrogen ($N_2$) into the flask. Next, the InZnP core according to Preparation Example 1 is added to the heated mixture within 10 seconds, and 0.02 mmol of Se/TOP is slowly injected thereinto. The resulting mixture is heated up to 280° C. Then, 0.02 mmol of S/TOP is added thereto, and the obtained mixture is heated up to 320° C. and reacted for 20 minutes. In addition, a mixed solution of 0.02 mmol of Se/TOP+0.04 mmol of S/TOP is slowly added thereto and reacted for 20 minutes. This same step was repeated by switching a mixing ratio of Se and S. The mixed solution of Se and S may be prepared by mixing 0.01 mmol of Se/TOP+0.05 mmol of S/TOP, 0.005 mmol of Se/TOP+0.1 mmol of S/TOP, 0.005 mmol of Se/TOP+0.2 mmol of S/TOP, and 0.2 mmol of a S/TOP solution and sequentially using them.

When the reaction is complete, the reactor is cooled down, and the obtained nanocrystal is centrifuged with ethanol and dispersed in toluene.

Figure 11:
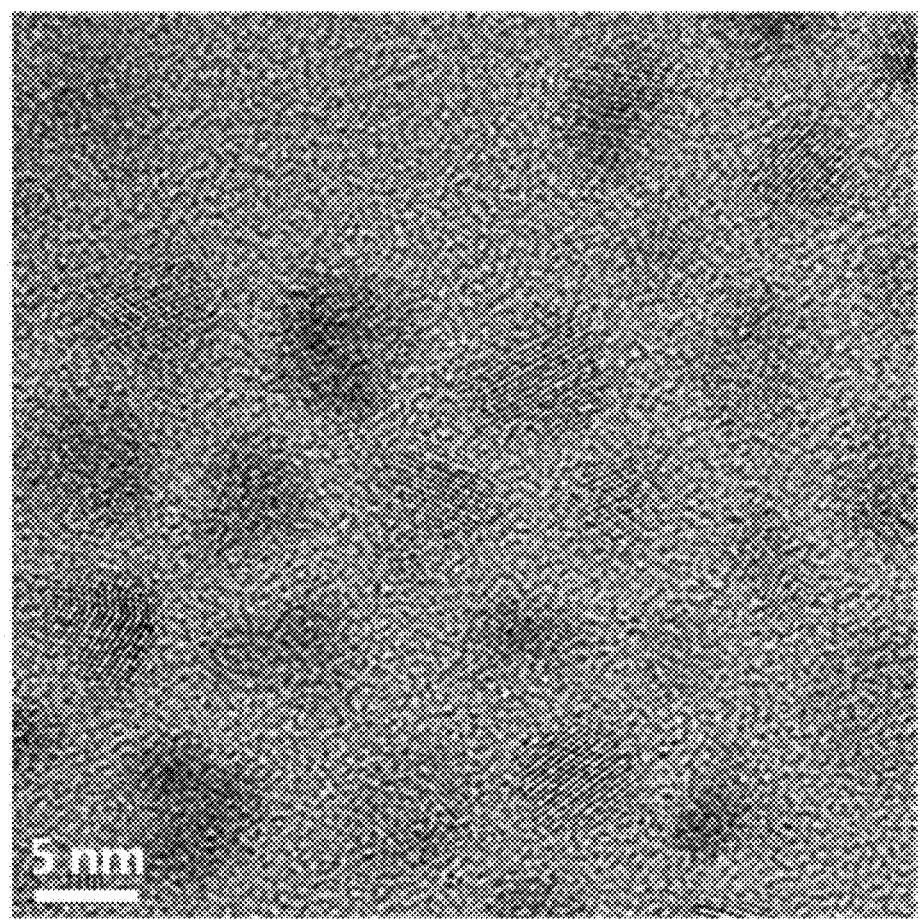
FIG. 11 is a TEM photograph showing the nanocrystal according to Example 6.

Herein, the nanocrystal has a UV first absorption maximum ranging from 510 to 515 nm, a PL emission peak ranging from 535 to 545 nm, a FWHM ranging from 38 to 44 nm, and QY ranging from 70 to 80%. In addition, the TEM photograph of the nanocrystal is provided in FIG. 11. As shown in FIG. 11, the nanocrystal according to the present exemplary embodiment has a relatively uniform average size of 6.05 nm.

According to the present exemplary embodiment, the Se/S ratio is 3.1 in the first ZnSeS monolayer contacting the core and 5.0 in the second ZnSeS monolayer, that is, it becomes higher at first, and then becomes gradually lower, and finally becomes lowest down to 0.59 in the outermost layer when the nanocrystal has the biggest diameter of 6 nm.

Based on the light emitting properties and full width at half maximum results, when Se and S in the first monolayer contacting the core have a ratio within the range according to the embodiment of the present disclosure, the Se and S do not necessarily maintain a specific concentration gradient in the additional ZnSeS monolayers. In other words, the concentration gradient can have the S:Se ratio gradually higher from the core to the outer layer, as shown in Example 5. Alternatively, as shown in Example 6, Se:S ratio becomes gradually higher up to one to two layers from the core and becomes gradually lower farther away from the core. There seems no significant difference in the light emitting properties between these two nanocrystals. As a result, the ratio between Se and S in the first monolayer contacting the core of a nanocrystal seems to be important.

Example 7: Preparation of InP/ZnSeS/ZnS Nanocrystal 0.3 mmol (0.056 g) of zinc acetate, 0.6 mmol (0.189 g) of oleic acid, and 10 mL of trioctylamine are added to a flask and vacuum-treated at 120° C. for 10 minutes. The vacuum-treated mixture is heated up to 180° C. when introducing nitrogen ($N_2$) in the flask. Next, the InP core according to Preparation Example 2 and 0.03 mmol of Se/TOP are added thereto within 10 seconds. The resulting mixture is heated up to 280° C. Then, 0.005 mmol of S/TOP is added to the heated mixture. The obtained mixture is then heated up to 320° C. and reacted for 20 minutes. Next, a mixed solution of 0.02 mmol of Se/TOP+0.01 mmol of S/TOP is slowly injected thereinto. The resulting mixture is reacted for 20 minutes. This same step is repeated by switching a mixing ratio of Se and S. The mixed solution is prepared by respectively mixing 0.01 mmol of Se/TOP+0.05 mmol of S/TOP, 0.005 mmol of Se/TOP+0.15 mmol of S/TOP, 0.005 mmol of Se/TOP+0.2 mmol of S/TOP, and 0.2 mmol of a S/TOP solution, which are sequentially used.

When the reaction is complete, the reactor is cooled down, and the InP/ZnSeS nanocrystal is centrifuged with ethanol and dispersed into toluene.

In addition, 0.3 mmol (0.056 g) of zinc acetate, 0.3 mmol (0.0947 g) of oleic acid, and 10 mL of trioctylamine are added to a flask and vacuum-treated at 120° C. for 10 minutes. The vacuum-treated mixture is heated up to 220° C. after substituting nitrogen ($N_2$) into the flask. Herein, the InP/ZnSeS nanocrystal toluene solution is added to the flask within 10 seconds, and 6 mmol of S/TOP is slowly injected into. The resulting mixture is heated up to 280° C. and reacted for 2 hours.

The obtained nanocrystal (QD) has a UV first absorption maximum ranging from 585 to 595 nm, a PL light emitting peak ranging from 615 to 625 nm, and a FWHM ranging from 40 to 45 nm. In addition, the nanocrystal (QD) has luminous efficiency (QY) of 70%. The results are provided in FIGS. 9 and 10.

While this disclosure has been described in connection with what is to presently considered to be practical exemplary embodiments, it is to be understood that the disclosure is not limited to the disclosed embodiments, but, on the contrary, is intended to cover various modifications and equivalent arrangements included within the spirit and scope of the appended claims.

What is claimed is:

1. A nanocrystal comprising:
   a core comprising a Group III element, and a Group V element; and
   a shell disposed on the core,
   wherein the shell comprises a first mole ratio of Se to S at a first position directly disposed on the core, a second mole ratio of Se to S at a second position between a surface of the core and an outermost surface of the shell, and a third mole ratio of Se to S at a third position on an outermost surface of the shell,
   wherein the shell comprises a compound of the formula $ZnSe_yS_{(1-y)}$ at the first position, wherein $0 \leq y \leq 1$, and
   wherein the shell has a mole ratio gradient of Se to S in a direction from the core to the outermost surface of the shell, the mole ratio gradient of Se to S comprises an increasing mole ratio of Se to S from the first mole ratio of Se to S to the second mole ratio of Se to S in a direction from the first position to the second position, and a decreasing mole ratio of Se to S from the second mole ratio of Se to S to the third mole ratio of Se to S in a direction from the second position to the third position.

2. The nanocrystal of claim 1, wherein the first mole ratio of Se to S ranges from about 2 to about 20.

3. The nanocrystal of claim 1, wherein the core further comprises a Group II metal.

4. The nanocrystal of claim 1, wherein the core comprises a compound selected from GaN, GaP, GaAs, GaSb, AlN, AlP, AlAs, AlSb, InN, InP, InAs, and InSb, GaNP, GaNAs, GaNSb, GaPAs, GaPSb, AlNP, AlNAs, AlNSb, AlPAs, AlPSb, InNP, InNAs, InNSb, InPAs, InPSb, GaAlNP, AlGaN, AlGaP, AlGaAs, AlGaSb, InGaN, InGaP, InGaAs, InGaSb, AlInN, AlInP, AlInAs, and AlInSb, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, or a combination thereof.

5. The nanocrystal of claim 3, wherein the Group II metal is selected from Zn, Cd, Hg, Mg, or a combination thereof.

6. The nanocrystal of claim 1, wherein the Group III element comprises In, and wherein the Group V element comprises P.

7. The nanocrystal of claim 1, wherein the shell comprises a compound of ZnS at the outermost surface.

8. The nanocrystal of claim 1, wherein the core comprises a compound of InZnP.

9. The nanocrystal of claim 1, wherein a photoluminescence of the nanocrystal has a full width at half maximum of less than or equal to about 45 nanometers.

10. The nanocrystal of claim 1, wherein the nanocrystal has a luminous efficiency QY of greater than or equal to about 70 percent.

11. The nanocrystal of claim 1, wherein the nanocrystal has a light emitting region in a photoluminescence spectrum of about 500 nanometers to about 750 nanometers.

12. The nanocrystal of claim 1, wherein the nanocrystal has a photoluminescence emission peak at a wavelength ranging from 535 nanometers to 545 nanometers.

13. A light emitting device comprising the nanocrystal according to claim 1.

14. The light emitting device of claim 13, wherein the light emitting device is a display, a sensor, a photodetector, a solar cell, a hybrid composite, or a bio-labeling device.

15. The nanocrystal of claim 1, wherein the third mole ratio of Se to S is less than the first mole ratio of Se to S.

* * * * *